(12) United States Patent
Haefner et al.

(10) Patent No.: US 8,338,970 B2
(45) Date of Patent: Dec. 25, 2012

(54) INTEGRATED CIRCUIT WITH ADJUSTING ELEMENTS AND METHOD FOR ITS MANUFACTURE

(75) Inventors: Juergen Haefner, Untereisesheim (DE); Alexander Kurz, Schwaebisch Hall (DE); Wolfgang Sinderhauf, Neckarsulm (DE); Matthias Tortschanoff, Villach (DE); Ulrich Wicke, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 117 days.

(21) Appl. No.: 13/034,963

(22) Filed: Feb. 25, 2011

(65) Prior Publication Data

US 2011/0147065 A1    Jun. 23, 2011

Related U.S. Application Data

(63) Continuation of application No. 11/431,061, filed on May 10, 2006, now abandoned.

(30) Foreign Application Priority Data

May 10, 2005    (DE) ............................. 2005 022 600

(51) Int. Cl.
    *H01L 23/544* (2006.01)
(52) U.S. Cl. ............. 257/797; 257/620; 257/E29.019
(58) Field of Classification Search .............. 348/414, 348/113, 460–463; 257/620; 333/214
    See application file for complete search history.

(56) References Cited

U.S. PATENT DOCUMENTS

| | | |
|---|---|---|
| 3,849,872 A | 11/1974 | Hubacher |
| 4,680,610 A | 7/1987 | Pammer |
| 6,365,443 B1 | 4/2002 | Hagiwara |
| 2002/0084469 A1 | 7/2002 | Shimizu |

FOREIGN PATENT DOCUMENTS

EP    1 079 430    2/2001

*Primary Examiner* — Mamadou Diallo
(74) *Attorney, Agent, or Firm* — Baker Botts L.L.P.

(57) ABSTRACT

An integrated circuit is disclosed with adjusting elements, which in a first manufacturing stage are connected via tracks to terminal pads lying outside the integrated circuit. At least one of the tracks of the integrated circuit lies on a surface of a region, which includes semiconductor material and in a second manufacturing stage is isolated by a pn junction from additional semiconductor material, which is adjacent to the region. Furthermore, a method for manufacturing this type of integrated circuit is also disclosed.

20 Claims, 2 Drawing Sheets

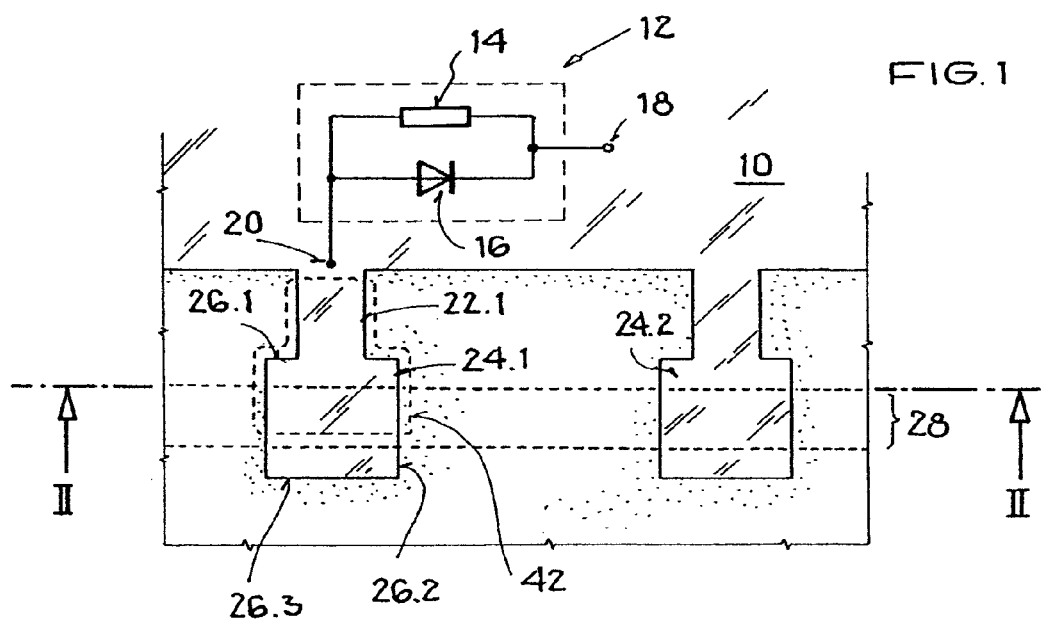
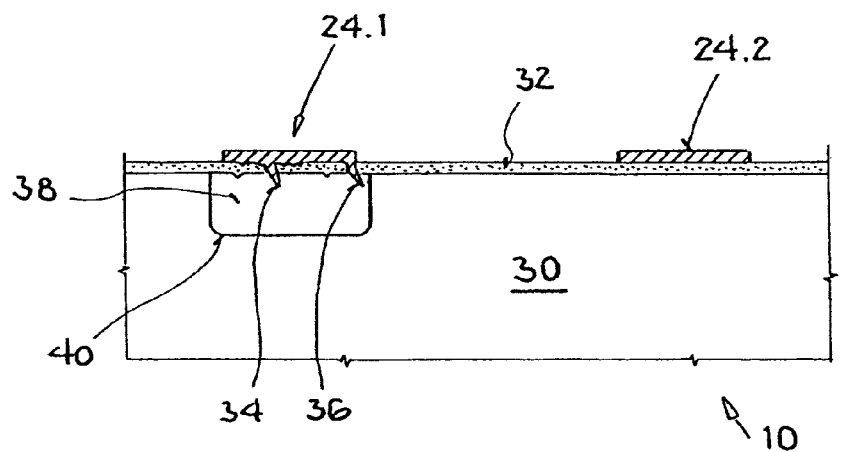

INTEGRATED CIRCUIT WITH ADJUSTING ELEMENTS AND METHOD FOR ITS MANUFACTURE

This application claims the benefit, under 35 U.S.C. §120, of U.S. patent application Ser. No. 11/431,061, filed 10 May 2006, which claims the benefit, under 35 U.S.C. §119(a), of German Patent Application No. DE 2005022600, filed 10 May 2005.

BACKGROUND OF THE INVENTION

1. Field of the Invention

The present invention relates to an integrated circuit with adjusting elements, which are connected in a first manufacturing stage via tracks to terminal pads lying outside the integrated circuit. Furthermore, the invention also relates to a method for manufacturing such an integrated circuit.

2. Description of the Background Art

Integrated circuits with adjusting elements are known in the conventional art. The adjusting elements typically have, for example, a parallel connection of a resistor and a diode, whereby the adjusting element lies between a positive potential, prevailing within the integrated circuit, and a reference potential, which prevails in the semiconductor substrate of the integrated circuit. The adjusting element is connected via the track to a terminal pad lying outside the integrated circuit, a so-called zap pad. Current pulses, with which the diode is shifted optionally to a permanently conductive state, are supplied if appropriate via the terminal pad and the track to the adjusting elements, so that the resistor lying parallel to the diode is optionally bypassed. Electrical parameters of the integrated circuit are adjusted once bit-by-bit by this one-time process within the scope of the manufacturing process, whereby the conductivity state of the diode (permanently conducting or permanently blocking) corresponds to a bit.

After the adjustment, the integrated circuit produced together with other integrated circuits on a wafer is diced. The dicing usually occurs by a mechanical separating process, for example, by a saw cut, which is made through the terminal pads lying outside the integrated circuit. For dicing, the integrated circuits produced on a wafer are separated from one another by a scribe line. The saw cut is made within the scribe line. During the dicing, it can happen that the metal of the terminal pads in the separation plane is smeared by chip formation or by plastic deformation resulting from mechanical stress, so that dielectric layers lying between the semiconductor material and the terminal pads are bridged within the depth of the semiconductor material of the integrated circuit. In this case, the potentials prevailing in the semiconductor substrate can act within the adjusting element via the metal bridge formed, for example, by a metal chip and in an undesirable way alter the electrical parameters, which were in fact to be set by the adjusting process. Metal bridges of this type therefore produce a shunt between the reference potential in the semiconductor substrate and the affected adjusting element.

SUMMARY OF THE INVENTION

It is therefore an object of the present invention to provide an integrated circuit with adjusting elements, in which such a shunt risk is minimized. Furthermore, the object of the invention is to provide a method for manufacturing this type of integrated circuit with a minimized shunt risk between the adjusting elements and the semiconductor material of the integrated circuit during dicing of integrated circuits.

This object is achieved in an integrated circuit, in that at least one of the tracks lies on a surface of a region, which includes semiconductor material and is isolated by a pn junction from additional semiconductor material, which is adjacent to the region.

Furthermore, this object is achieved by a method of the aforementioned type in that at least one region of semiconductor material is produced, which is isolated by a pn junction from additional semiconductor material, which is adjacent to the region, and a track is produced on the region of semiconductor material. The aforementioned shunt risk is minimized by these features. The pn junction represents an additional isolation structure, which is integrated within the depth of the semiconductor substrate and requires no additional volume. Also, no additional manufacturing steps are necessary, because the region can be produced more or less alongside the lithography, masking, and doping steps taking place in any event for structuring the integrated circuit. The expansion of the region and thereby the distancing of the isolating pn junction from cut-through metal cross sections can be adjusted both in the lateral and vertical direction by control of process parameters in the aforementioned steps without negatively impacting the area available for the integrated circuit.

In view of embodiments of the circuit, the at least one track can run between the integrated circuit and an edge of the terminal pad, whose distance to the integrated circuit is smaller than the distances between other edges of the terminal pad and the integrated circuit.

In other words, the track in this embodiment runs between the terminal pad and the integrated circuit. Due to this space-saving arrangement, at a given lateral expansion of the integrated circuit and the terminal pads, a maximum number of terminal pads can be placed on a side of the integrated circuit, which results in a corresponding maximum number of adjustment options.

Also, a remainder of the terminal pad and/or the track still connected to the integrated circuit after dicing of the integrated circuit can be completely isolated from the neighboring semiconductor material by the region and the pn junction.

The region therefore extends under the track at least up to one of the separation planes forming during the dicing. The risk of shunts, which could arise as a result of metal smearing occurring during the dicing in the separation planes, is minimized thereby.

In an alternative embodiment, the at least one track runs partially beside a terminal pad and in the first manufacturing stage is connected to the terminal pad and in a second manufacturing stage is separated from the terminal pad.

This embodiment already represents an alternative solution to the aforementioned object in conjunction with the category-defining features.

The track in the separating plane has a smaller cross section than the terminal pad. Because the track in the second manufacturing stage is separated from the terminal pad, the metal cross section causing the potential shunts is limited to the smaller cross section of the track, which further reduces the probability of shunts. The cross section of the track can be smaller by three powers of ten than the cross section of the terminal pad. Because the larger cross section of the terminal pad in the second manufacturing stage is no longer connected via the track to the adjusting element, metal bridges from the cross section of the terminal pad can have no effect on the adjusting element. For this reason, the features of this embodiment can achieve the aforementioned object both in addition to the blocking layer isolation and also alone.

It is preferred, furthermore, that the track is covered at least partially by a passivating layer.

The passivating layer, which can include, for example, an oxide or nitride of the semiconductor material, reduces the mechanical stress, which acts on the cross section of the track during the dicing step. The likelihood of the occurrence of metal smearing is already reduced by reduction of the mechanical stress.

The terminal pads and the at least one track in an integrated circuit with a first metallization level, which is at a small distance to the semiconductor material of the circuit, and a second metallization level, which is at a greater distance to the semiconductor material, can have only the metal of the second metallization level.

In contrast, in the conventional integrated circuit, the terminal pad is realized by an arrangement of the first metallization level and the second metallization level one on top of the other. Because in the embodiment mentioned here only the second metallization level, which is at a greater distance to the semiconductor material, is used for the outward connection of the adjusting element, reduction of the metal cross section in the separation plane occurs and thereby a reduction of the size of possible metal bridges, which could cause shunts.

In view of alternatives and/or embodiments of the manufacturing process, the track can be produced between the integrated circuit and an edge of the terminal pad, whose distance to the integrated circuit is smaller than the distances between the other edges of the terminal pad and the integrated circuit, so that at least one subsection, facing the track, of the terminal pad also lies within the region.

Further, in the first manufacturing stage the circuit is placed on a wafer together with other integrated circuits and is separated by a dicing step from the other integrated circuits in such a way that in a second manufacturing stage the subsection is totally isolated by the pn junction from the neighboring semiconductor material.

Furthermore, the track can be covered at least partially by a passivating layer before the dicing step.

Also, the at least one track is produced in such a way that it runs partially beside a terminal pad, in the first manufacturing stage the circuit is placed on a wafer together with other integrated circuits, and in a second manufacturing stage is separated by a dicing step from the other integrated circuits in such a way that a remainder of the track is separated from the terminal pad.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a plan view of a portion of an integrated circuit with an adjusting element and terminal pads lying outside the integrated circuit;

FIG. 2 is a section through the integrated circuit of FIG. 1;

DETAILED DESCRIPTION

Figure 3:
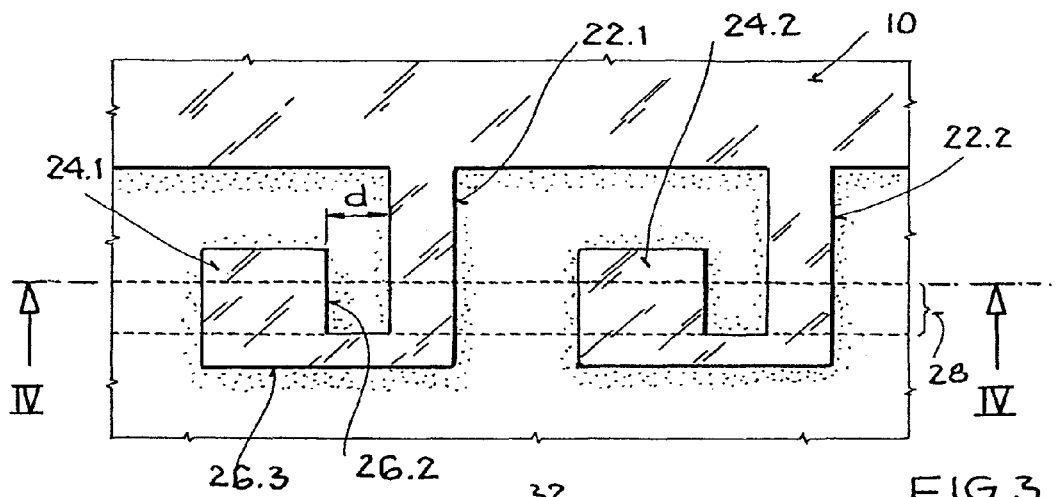
FIG. 3 is a plan view of an alternative embodiment of the integrated circuit with an alternative routing of tracks.

FIG. 1 shows an integrated circuit 10 with an adjusting element 12, which is shown here as representative of many of the adjusting elements of integrated circuit 10 and has an ohmic resistor 14 and a diode 16 parallel thereto. In electrical terms, adjusting element 12 lies between a first terminal 18 of the integrated circuit 10 and a second terminal 20, which represents a connection of adjusting element 12 to a track 22.1 leading out of integrated circuit 10.

The track 22.1 leads to a terminal pad 24.1, by means of which second terminal 20 can be connected to a measuring and adjusting device, which is not shown in FIG. 1. The measuring and adjusting device has, e.g., a contact spider, the legs of which are placed on terminal pad 24.1 and other terminal pads 24.2, etc., and by means of which electrical pulses are fed into adjusting element 12. In so doing, the electrical pulses are predefined in such a way that the function (blocking action for a current direction) of diode 16 is optionally retained or shifted once to a permanently conducting state (no blocking action), in which resistor 14 is bypassed for both possible current directions by diode 16.

In this way, integrated circuit 10 parameters, which can be influenced via first terminal 18 of adjusting element 12 are set bit by bit. It is understood here that an adjusting element 12 may also have a different structure than the one shown in FIG. 1. The presentation of the internal structure of the adjusting element in FIG. 1 therefore only serves to illustrate the basic principle of adjusting elements 12 of this type.

In the embodiment of FIG. 1, track 22.1 runs parallel to the shortest possible connection between terminal pad 24.1 and second terminal 20 in integrated circuit 10. In other words: The at least one track 22.1 runs between integrated circuit 10 and an edge 26.1 of terminal pad 24.1, whose distance to integrated circuit 10 is smaller than the distances between other edges 26.2, 26.3 of terminal pad 24.1 and integrated circuit 10.

Integrated circuit 10 in the presentation of FIG. 1 is located together with other integrated circuits in a first manufacturing stage on a mutual wafer. After the described adjustment of its electrical parameters, integrated circuit 10 is transferred to a second manufacturing stage for a dicing step. Dicing occurs, for example, by a saw cut within a scribe line. The saw cut line 28 goes through terminal pads 24.1, 24.2, which are no longer necessary after the adjustment, so that these are destroyed.

FIG. 2 shows a view of the cut surface (sawed area) of a diced integrated circuit 10 of FIG. 1, which was cut through lengthwise along the line II-II. Here, the right half of FIG. 2 with the cut through terminal pad 24.2 shows the theoretical ideal case of a saw cut, which does not change the structure of integrated circuit 10 in the separated area. Then, in particular, a dielectric layer 32 lying between a semiconductor substrate 30 and terminal pad 24.2 is not damaged and smearing of the metal of terminal pad 24.2 also does not occur.

However, the mechanical stress occurring during sawing in fact causes structural changes, as they are shown in the left half of FIG. 2. Particularly critical is a formation of chips of the metal of the terminal pads or smearing of the metal of the terminal pads, thus changes in the cross section of the metallic terminal pads by plastic deformations. As shown in FIG. 2 using the example of terminal pad 24.1, such plastic deformations can lead to metal bridges 34, 36, which extend beyond dielectric layer 32 into the underlying semiconductor material of semiconductor substrate 30. Without further countermeasures, this can lead to the situation that a reference potential, prevailing in semiconductor substrate 30, has an undesirable effect on the previously adjusted electrical parameters of integrated circuit 10 via metal bridges 34, 36 and the remainder of terminal pad 24.1 and via track 22.1 and adjusting element 12 in that, e.g., a leak current from first terminal 18 via adjusting element 12, track 22.1, the remainder of terminal pad 24.1, and metal bridges 34, 36 into semiconductor substrate 30 is possible.

In the embodiment of the left half of FIG. 2, such undesirable leak currents are prevented by a region 38 of the semiconductor material, which is isolated by a pn junction 40 from additional semiconductor material of semiconductor substrate 30, which is adjacent to region 38. The semiconductor material of region 38 therefore has a different conductivity type than the adjacent semiconductor material of semiconductor substrate 30. If the semiconductor substrate 30 has a p conductivity type, the semiconductor material of region 38 has an n conductivity. Together with the aforementioned potential circumstances, thus, a positive potential at first terminal 18 and a (negative thereto) reference potential in semiconductor substrate 30, when metal bridges 34, 36 occur, region 38 is then positively charged to a certain extent, so that pn junction 40 is automatically polarized in the blocking direction and prevents a leak current via metal bridges 34, 36 into the semiconductor material of semiconductor substrate 30.

To produce this desired effect, region 38 must have a sufficient expansion. It must therefore in each case lie within the plane of the saw cut II-II in FIG. 1 and be so deep and wide in FIG. 2 that it is also not bridged by metal bridges 34, 36. According to the invention, an expansion of about $10\mu$ into the depth of semiconductor substrate 30 and a lateral projection of about $10\mu$ in each case, measured from the right and left edge of terminal pad 24.1, is sufficient for this. It is understood, however, that depending on mechanical stress which occurs during the sawing process, and depending on the cross-sectional area of the cut metal, different values may also be necessary.

The region is preferably expanded so far in the direction of track 22.1 of FIG. 1 that it extends below track 22.1 to assure that the cut plane II-II of FIG. 1 definitely runs through region 38 also with a shift of the saw cut line 28 due to manufacturing tolerances. When saw cut line 28 is in the position as shown in FIG. 1, region 38 should also extend slightly under terminal pad 24.1. This assures that a remainder of the pad 24.1 and/or track 22.1 still connected to integrated circuit 10 after dicing of integrated circuit 10 is completely isolated from the neighboring semiconductor material of semiconductor substrate 30 by region 38 and pn junction 40. The dashed line 42 in FIG. 1 indicates possible bounds of region 38 and thereby of pn junction 40 in a view from above.

FIG. 3 shows an alternative course of tracks 22.1, 22.2, which in a first manufacturing stage connect terminal pads 24.1, 24.2 with integrated circuit 10. The electrically conductive paths 22.1, 22.2 here no longer run on the shortest route between terminal pads 24.1, 24.2 and integrated circuit 10, but in each case partially beside a terminal pad 24.1, 24.2 at a distance d, in order to then bend into an L shape and to connect terminal pads 24.1, 24.2 laterally to an edge 26.2 or also from the back, to an edge 26.3.

Figure 4:
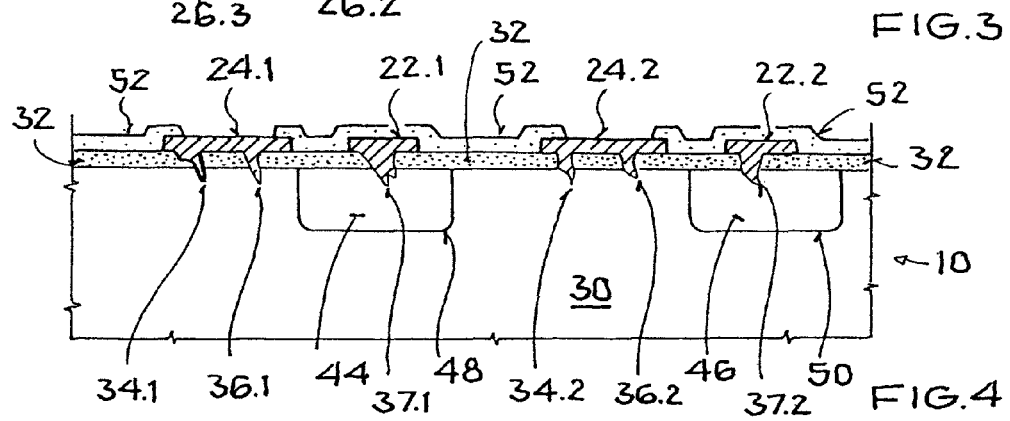
FIG. 4 is a section through the integrated circuit of FIG. 3.

In contrast to the subject of FIGS. 1 and 2, in the subject of FIG. 3, the remainders of terminal pads 24.1, 24.2, which remain after an adjustment of electrical parameters and isolation of integrated circuit 10 by a saw cut along scribe line 28, are completely separated from their respectively assigned tracks 22.1, 22.2 and thereby also from integrated circuit 10. FIG. 4 shows the cut area, formed lengthwise along the line IV-IV in FIG. 3, of integrated circuit 10.

Due to the separation, metal bridges 34.1, 36.1, 34.2, 36.2 of terminal pads 24.1, 24.2 can no longer have a negative effect on integrated circuit 10. Leak currents can still be carried at all only by plastic deformations, forming metal bridges 37.1, 37.2, of cross sections of tracks 22.1 and 22.2.

Because the cross-sectional areas of tracks 22.1, 22.2, however, are still smaller than the cross sections of terminal pads 24.1, 24.2, a reduced shunt probability results, so that the routing of tracks 22.1, 22.2 according to FIGS. 3 and 4 even alone can achieve the object. This reduced shunt probability is reduced further by regions 44 and 46 and the pn junctions 48 and 50 occurring as a result of regions 44, 46, the junctions which, however, can also be eliminated within the scope of an alternative embodiment. In addition, regions 44 and 46 in combination with pn junctions 48 and 50 prevent a low-ohmic connection between tracks 22.1 and 22.2. The corresponding embodiments for region 38 and semiconductor substrate 30 in the explanation for FIG. 2 apply to the doping of regions 44 and 46, which determines the conductivity type of regions 44 and 46, and for the conductivity type of the semiconductor substrate 30 surrounding regions 44, 46, Another advantage of the subject of FIG. 4 is that tracks 22.1, 22.2 may be covered before the adjustment with a passivating layer 52, which during the subsequent dicing step reduces the mechanical stress acting on the cross section of tracks 22.1, 22.2. The terminal pads 24.1, 24.2, in contrast, can be simply covered with passivating layer 52, because they must be contacted from outside for the adjustment.

Overall, in the subject of FIG. 4, a reduction of the shunt probability results due to three measures, which can be used individually or in combination with one another. The first measure includes the formation of regions 44, 46 and pn junctions 48, 50 below tracks 22.1, 22.2. The second measure includes the modified routing, which leads to a separation of the remainder of terminal pads 24.1 and 24.2 from tracks 22.1, 22.2 in the second manufacturing stage of integrated circuit 10 after the dicing step. The third measure includes the covering of the tracks with a passivating layer 52, for example, a protective oxide.

Figure 5:
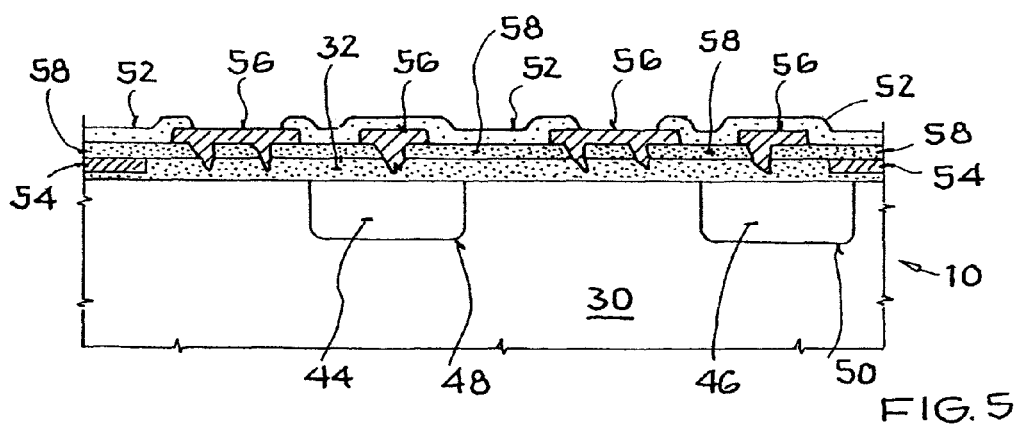
FIG. 5 is a section through an integrated circuit which has two metallization planes.

FIG. 5 illustrates an additional difference to the conventional art, which is also realized preferably in combination with at least one of the noted measures. Typically, integrated circuits 10 have at least two metallization levels 54, 56, whereby the terminal pads in the conventional art are realized by a stack of terminal pads of a first metallization level 54 and a second metallization level 56. As a result, a relatively large metal cross-sectional area forms, from which accordingly large metal bridges can grow due to plastic deformations. Within the scope of an embodiment of the invention, it is therefore preferred to use only one of two metallization levels 54, 56 for the terminal pads. In the example of FIG. 5, this is the top, second metallization level 56, which is separated from the bottom, first metallization level 54 by an additional dielectric layer 58. This additional dielectric layer 58 brings the additional advantage that the distance between the terminal pads and semiconductor substrate 30 is increased further, which also reduces the probability of the formation of shunts during the dicing step.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. An apparatus comprising:
   a track on a substrate, the track coupling at least a portion of a circuit on the substrate to a terminal pad on the substrate; and
   a p-n junction configure to substantially isolate a region of the substrate substantially underneath the track and the terminal pad.

2. The apparatus of claim 1, further comprising an adjusting element coupled between the portion of the circuit and the terminal pad, the adjusting element configured to provide one or more of a conductive state and a resistive state.

3. The apparatus of claim 1, further comprising a dielectric layer formed between the track and the region.

4. The apparatus of claim 1, wherein the terminal pad and the track are fabricated using a first metallization level, the first metallization level having a greater distance from the semiconductor material than a second metallization level.

5. The apparatus of claim 1, wherein the region has a different conductivity type than adjacent material.

6. The apparatus of claim 1, further comprising a passivation layer formed over the track.

7. The apparatus of claim 1, wherein the p-n junction has a lateral dimension larger than a lateral dimension of the terminal pad and track.

8. A method comprising:
   disposing on a substrate a track coupling a terminal pad on the substrate to at least a portion of a circuit on the substrate; and
   substantially electrically isolating a region substantially underneath the track and the terminal pad using a p-n junction.

9. The method of claim 8, further comprising providing one or more of a conductive state and a resistive state between the portion of the circuit and the terminal pad using an adjusting element.

10. The method of claim 8, further comprising forming a dielectric layer between the track and the region.

11. The method of claim 8, further comprising fabricating the terminal pad and the track using a first metallization level, the first metallization level having a greater distance from the semiconductor material than a second metallization level.

12. The method of claim 8, further comprising doping the region with a different conductivity type than adjacent material.

13. The method of claim 8, further comprising forming a passivation layer over the track.

14. The method of claim 8, wherein the p-n junction has a lateral dimension larger than a lateral dimension of the terminal pad and track.

15. An apparatus comprising:
   a substrate comprising material having a first conductivity type;
   a track on the substrate, the track coupling at least a portion of a circuit on the substrate to a terminal pad on the substrate;
   a p-n junction configured to substantially isolate a region of the substrate substantially underneath the track and the terminal pad, the region comprising a material having a second conductivity type different than the first conductivity type; and
   a device coupled to the terminal pad on the substrate and configured to provide electrical signals.

16. The apparatus of claim 15, further comprising an adjusting element coupled between the portion of the circuit on the substrate and the terminal pad on the substrate, the adjusting element configured to provide one or more of a conductive state and a resistive state.

17. The apparatus of claim 15, further comprising a dielectric layer formed between the track and the region.

18. The apparatus of claim 15, wherein the terminal pad and the track are fabricated using a first metallization level, the first metallization level having a greater distance from the semiconductor material than a second metallization level.

19. The apparatus of claim 15, further comprising a passivation layer formed over the track.

20. The apparatus of claim 15, wherein the p-n junction has a lateral dimension larger than a lateral dimension of the terminal pad and track.

* * * * *

UNITED STATES PATENT AND TRADEMARK OFFICE
CERTIFICATE OF CORRECTION

PATENT NO.         : 8,338,970 B2
APPLICATION NO.    : 13/034963
DATED              : December 25, 2012
INVENTOR(S)        : Juergen Haefner et al.

Page 1 of 1

It is certified that error appears in the above-identified patent and that said Letters Patent is hereby corrected as shown below:

On the Title page of the patent: (75) Inventors:

After "Villach" and before "Ulrich" delete "(DE);" and insert --(AT);--.

Signed and Sealed this
Fourteenth Day of October, 2014

Michelle K. Lee
*Deputy Director of the United States Patent and Trademark Office*